(12) United States Patent
Lim et al.

(10) Patent No.: US 12,323,165 B2
(45) Date of Patent: Jun. 3, 2025

(54) ERROR CORRECTION DEVICE AND ERROR CORRECTION METHOD

(71) Applicant: Samsung Electronics Co., Ltd., Suwon-si (KR)

(72) Inventors: Jinsoo Lim, Suwon-si (KR); Changkyu Seol, Suwon-si (KR); Myoungbo Kwak, Suwon-si (KR); Daewook Kim, Suwon-si (KR); Dongjin Park, Suwon-si (KR); Youngdon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 18/511,740

(22) Filed: Nov. 16, 2023

(65) Prior Publication Data

US 2024/0178863 A1    May 30, 2024

(30) Foreign Application Priority Data

Nov. 28, 2022    (KR) .................. 10-2022-0162035

(51) Int. Cl.
  *H03M 13/00*    (2006.01)
  *H03M 13/15*    (2006.01)
  (Continued)

(52) U.S. Cl.
  CPC ... *H03M 13/1595* (2013.01); *H03M 13/2778* (2013.01); *H03M 13/2927* (2013.01)

(58) Field of Classification Search
  CPC ......... H03M 13/1595; H03M 13/2778; H03M 13/2927; H03M 13/2921
  See application file for complete search history.

(56) References Cited

U.S. PATENT DOCUMENTS 6,125,469 A * 9/2000 Zook ................. G11B 20/1833
    714/769
6,694,477 B1 * 2/2004 Lee ........................ H03M 13/03
    714/755

(Continued)

FOREIGN PATENT DOCUMENTS

KR    101753971 B1    7/2017

OTHER PUBLICATIONS

The Evolution of the PCI Express Specification: On its Sixth Generation, Third Decade and Still Going Strong, posted on Jan. 11, 2022, by Dr. Debendra Das Sharma, Member and Treasurer of PCI-SIG Board (available at https://pcisig.com/blog/evolution-pci-express-specification-its-sixth-generation-third-decade-and-still-going-strong) (10 pages).

*Primary Examiner* — Esaw T Abraham
(74) *Attorney, Agent, or Firm* — Muir Patent Law, PLLC

(57) ABSTRACT

A device includes a receiver configured to receive a plurality of Error Correction Code (ECC) codewords transmitted from an external device through a channel including one or more lanes; an ECC decoder configured to generate a plurality of post ECC codewords by performing error correction with respect to the plurality of ECC codewords and generating a first cyclic redundancy check (CRC) codeword based on the plurality of post ECC codewords; a CRC checker configured to determine whether an error exists in the first CRC codeword; and a post ECC decoder configured to, when it is determined that the error exists in the first CRC codeword, generate a second CRC codeword by estimating a remaining error position based on error correction result information received from the ECC decoder and performing remaining error correction with respect to the plurality of post ECC codewords based on the remaining error position.

20 Claims, 11 Drawing Sheets

(51) Int. Cl.
    *H03M 13/27*     (2006.01)
    *H03M 13/29*     (2006.01)

(56) References Cited

U.S. PATENT DOCUMENTS

| | | |
|---|---|---|
| 6,732,324 B2 | 5/2004 | Koppelaar |
| 7,103,824 B2 * | 9/2006 | Halford ............... G06F 11/1076 714/759 |
| 7,571,372 B1 * | 8/2009 | Burd ................. G11B 20/1833 714/781 |
| 7,694,208 B2 * | 4/2010 | Ball ..................... H03M 13/19 714/756 |
| 8,190,962 B1 * | 5/2012 | Chen ................ H03M 13/2906 714/752 |
| 8,719,677 B2 * | 5/2014 | Alrod .................. G06F 11/1048 714/766 |
| 9,083,386 B2 | 7/2015 | Umeda |
| 9,088,300 B1 * | 7/2015 | Chen ................... H03M 13/091 |
| 9,577,673 B2 * | 2/2017 | Parthasarathy ..... H03M 13/152 |
| 11,398,876 B2 | 7/2022 | Newman et al. |
| 2020/0304150 A1 | 9/2020 | Sharma et al. |
| 2020/0364129 A1 | 11/2020 | Sharma |
| 2021/0119730 A1 | 4/2021 | Sharma et al. |

\* cited by examiner

FIG. 4

|  | Lane 1 | Lane 2 | Lane 3 | Lane 4 |
|---|---|---|---|---|
| TLP | TLP 0 | TLP 1 | TLP 2 | TLP 3 |
|  | TLP 4 | TLP 5 | TLP 6 | TLP 7 |
|  | TLP 8 | TLP 9 | TLP 10 | TLP 11 |
|  | ⋮ | ⋮ | ⋮ | ⋮ |
|  | TLP 224 | TLP 225 | TLP 226 | TLP 227 |
|  | TLP 228 | TLP 229 | TLP 230 | TLP 231 |
|  | TLP 232 | TLP 233 | TLP 234 | TLP 235 |
| DLP CRC ECC | DLP 0 | DLP 1 | DLP 2 | DLP 3 |
|  | DLP 4 | DLP 5 | CRC 0 | CRC 1 |
|  | CRC 2 | CRC 3 | CRC 4 | CRC 5 |
|  | CRC 6 | CRC 7 | ECC 0A | ECC 0B |
|  | ECC 1A | ECC 1B | ECC 2A | ECC 2B |

FIG. 5

| Lane 1 | Lane 2 | Lane 3 | Lane 4 |
|---|---|---|---|
| ~~TLP 0~~ | TLP 1 | TLP 2 | TLP 3 |
| TLP 4 | TLP 5 | TLP 6 | TLP 7 |
| TLP 8 | TLP 9 | TLP 10 | TLP 11 |
| ~~TLP 12~~ | TLP 13 | TLP 14 | TLP 15 |
| TLP 16 | TLP 17 | TLP 18 | TLP 19 |
| ⋮ | ⋮ | ⋮ | ⋮ |

⇩ De-Interleaving

| | | | | | | |
|---|---|---|---|---|---|---|
| First ECC CW | TLP 0 (X) | TLP 3 | TLP 6 | TLP 9 | TLP 12 (X) | ... |
| Second ECC CW | TLP 1 | TLP 4 (O) | TLP 7 | TLP 10 | TLP 13 | ... |
| Third ECC CW | TLP 2 | TLP 5 | TLP 8 (O) | TLP 11 | TLP 14 | ... |

FIG. 6

| Lane 1 | Lane 2 | Lane 3 | Lane 4 |
|--------|--------|--------|--------|
| TLP 0  | TLP 1  | TLP 2  | TLP 3  |
| TLP 4  | TLP 5  | TLP 6  | TLP 7  |
| TLP 8  | TLP 9  | TLP 10 | TLP 11 |
| TLP 12 | TLP 13 | TLP 14 | TLP 15 |
| TLP 16 | TLP 17 | TLP 18 | TLP 19 |
| ⋮      | ⋮      | ⋮      | ⋮      |

⇓ De-Interleaving

| First ECC CW  | ⋯ | TLP 6 | TLP 9  | TLP 12 | TLP 15 | ⋯ |
|---------------|---|-------|--------|--------|--------|---|
| Second ECC CW | ⋯ | TLP 7 | TLP 10 | TLP 13 | TLP 16 | ⋯ |
| Third ECC CW  | ⋯ | TLP 8 | TLP 11 | TLP 14 | TLP 17 | ⋯ |

FIG. 7

| Lane 1 | Lane 2 | Lane 3 | Lane 4 |
|---|---|---|---|
| TLP 0 | TLP 1 | TLP 2 | TLP 3 |
| TLP 4 | TLP 5 | TLP 6 | TLP 7 |
| TLP 8 | TLP 9 | TLP 10 | TLP 11 |
| TLP 12 | TLP 13 | TLP 14 | TLP 15 |
| TLP 16 | TLP 17 | TLP 18 | TLP 19 |
| ⋮ | ⋮ | ⋮ | ⋮ |

⬇ De-Interleaving

| | | | | | | |
|---|---|---|---|---|---|---|
| First ECC CW | TLP 0 | TLP 3 | TLP 6 | TLP 9 | TLP 12 | ... |
| Second ECC CW | TLP 1 | TLP 4 | TLP 7 | TLP 10 | TLP 13 | ... |
| Third ECC CW | TLP 2 | TLP 5 | TLP 8 | TLP 11 | TLP 14 | ... |

ERROR CORRECTION DEVICE AND ERROR CORRECTION METHOD

CROSS-REFERENCE TO RELATED APPLICATION

This application is based on and claims priority under 35 U.S.C. § 119 to Korean Patent Application No. 10-2022-0162035, filed on Nov. 28, 2022, in the Korean Intellectual Property Office, the disclosure of which is incorporated by reference herein in its entirety.

BACKGROUND

The inventive concept relates to an error correction device, and more particularly, to an error correction device configured to perform error correction with respect to remaining errors.

Devices, such as memory devices, processors, and displays included in electronic devices, may transmit data to one another. Increase in a communication rate and a data transmission amount due to the development of technologies may result in an increase in the number of errors occurring on bits included in data. Codes, such as an Error Correction Code (ECC), may be used to correct such errors in data. When an error is not corrected through such an error correction method, a device that has received data may request data re-transmission. Performance of data re-transmission costs a time period relatively longer than that of error correction, and a broadband width of a channel in an electronic device decreases as a result. Therefore, there is requirement for development of a method of more securely correcting errors in data.

SUMMARY

The inventive concept provides an error correction device configured to perform remaining error correction based on error correction result information when error correction is performed and it is determined that an error exists.

According to an aspect of the inventive concept, there is provided a device including a receiver configured to receive a plurality of Error Correction Code (ECC) codewords transmitted from an external device through a channel including one or more lanes, an ECC decoder configured to generate a plurality of post ECC codewords by performing error correction with respect to the plurality of ECC codewords and generate a first Cyclic Redundancy Check (CRC) codeword based on the plurality of post ECC codewords, a CRC checker configured to determine whether an error exists in the first CRC codeword, and a post ECC decoder configured to, when it is determined that the error exists in the first CRC codeword, generate a CRC codeword by estimating a remaining error position based on error correction result information received from the ECC decoder and perform remaining error correction with respect to the plurality of post ECC codewords based on the remaining error position.

According to another aspect of the inventive concept, there is provided a method of correcting errors in a plurality of ECC codewords, the method including receiving a plurality of ECC codewords from an external device through a channel including one or more lanes, generating a plurality of post ECC codewords by performing error correction with respect to the plurality of ECC codewords and generating a first CRC codeword based on the plurality of post ECC codewords, determining whether an error exists in the first CRC codeword, estimating a remaining error position based on error correction result information when it is determined that the error exists in the first CRC codeword, and generating a second CRC codeword by performing remaining error correction with respect to the plurality of post ECC codewords based on the remaining error position.

According to another aspect, there is provided a device including a receiver configured to receive a plurality of ECC codewords transmitted from an external device through a channel including one or more lanes, an ECC decoder configured to generate a plurality of post ECC codewords by performing error correction with respect to the plurality of ECC codewords and generate a first CRC codeword based on the plurality of post ECC codewords, and a CRC checker configured to determine whether an error exists in the first CRC codeword, wherein the ECC decoder is configured to, when it is determined that the error exists in the first CRC codeword, estimate a remaining error position based on error correction result information received from the ECC decoder and generate a second CRC codeword by performing remaining error correction with respect to the plurality of ECC codewords based on the remaining error position.

BRIEF DESCRIPTION OF THE DRAWINGS

Embodiments of the inventive concept will be more clearly understood from the following detailed description taken in conjunction with the accompanying drawings in which:

FIG. 4 is a diagram of an example of a method in which a plurality of ECC codewords received by a device, according to an example embodiment, are interleaved to a plurality of lanes;

FIG. 5 is a diagram for describing a method of estimating a remaining error position when an error of a burst error pattern occurs to data received by a device, according to an example embodiment;

FIG. 6 is a diagram for describing a method of estimating a remaining error position when an error of a first crosstalk pattern occurs to data received by a device, according to an example embodiment;

FIG. 7 is a diagram for describing a method of estimating a remaining error position when an error of a second crosstalk pattern occurs to data received by a device, according to an example embodiment;

DETAILED DESCRIPTION OF THE EMBODIMENTS

Figure 1:
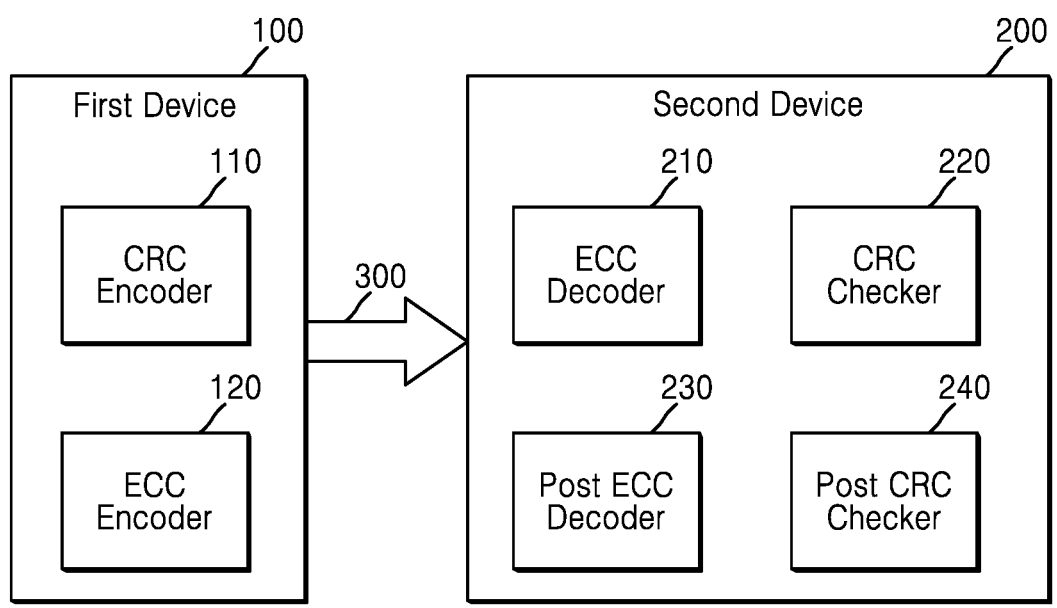
FIG. 1 is a block diagram of an electronic device, according to an example embodiment.

Hereinafter, embodiments of the inventive concept will be described in detail with reference to the accompanying drawings. Like reference numerals refer to like elements throughout.

FIG. 1 is a block diagram of an electronic device 10, according to an example embodiment.

Referring to FIG. 1, the electronic device 10 according to an embodiment may include a first device 100, a second device 200, and a channel 300.

In an embodiment, the electronic device 10 may include any one of smartphones, tablet computers, smart TVs, mobile phones, personal digital assistants (PDA), laptops, media players, microservers, global positioning system (GPS) devices, electronic book terminals, digital broadcasting terminals, navigation devices, kiosks, MP3 players, digital cameras, home appliances, and other mobile or non-mobile computing devices, but the inventive concept is not limited thereto. In addition, the electronic device 10 may include wearable devices such as watches, glasses, hairbands, and rings having a data processing function, but the inventive concept is not limited thereto, and the electronic device 10 may include any type of devices operating based on an operating system (OS) using processors.

The first device 100 and the second device 200 may include any one of devices generally included in the electronic device 10, such as a central processing unit (CPU), a graphics processing unit (GPU), an application processor (AP), dynamic random access memory (DRAM), a non-volatile memory device, a memory controller, a display, and the like included in the electronic device 10.

The first device 100 may encode transmission data and may transmit the transmission data to the second device 200 through the channel 300. Accordingly, the first device 100 may be referred to as a transmission device.

The transmission data, which is the data to be transmitted to the second device 200 by the first device 100, may include a plurality of symbols. In an embodiment, a symbol may include a symbol modulated using a Pulse Amplitude Modulation 4 (PAM4) method, and for example, a symbol may include one byte.

The first device 100 may include a Cyclic Redundancy Check (CRC) encoder 110 and an Error Correction Code (ECC) encoder 120.

The CRC encoder 110 may generate a CRC codeword by generating a CRC symbol corresponding to the transmission data.

More particularly, the CRC encoder 110 may generate the CRC symbol by performing a CRC encoding operation with respect to the transmission data. The CRC encoder 110 may generate the CRC codeword by combining the CRC symbol, which has been generated, with the transmission data.

In an embodiment, the CRC encoder 110 may generate the CRC codeword using a remainder of a result obtained by dividing the transmission data by the CRC generation code.

The ECC encoder 120 may generate a plurality of ECC codewords by generating ECC symbols respectively corresponding to the CRC codewords.

More particularly, the ECC encoder 120 may de-interleave the CRC codewords into a plurality of codewords. The ECC encoder 120 may generate a plurality of ECC symbols by performing an ECC encoding operation with respect to each of the plurality of codewords generated by de-interleaving the CRC codewords. The ECC encoder 120 may generate the plurality of ECC codewords by combining the plurality of ECC symbols respectively with the plurality of codewords generated by de-interleaving the CRC codewords.

In an embodiment, the ECC encoder 120 may perform the ECC encoding operation using a Reed Solomon code. For example, the ECC encoder 120 may perform the ECC encoding operation using Equation 1 below.

$$\begin{bmatrix} 1 & 1 & 1 & \ldots & 1 & 1 & 1 \\ \alpha^n & \alpha^{n-1} & \alpha^{n-2} & & \alpha^3 & \alpha^2 & \alpha \end{bmatrix} B = \begin{bmatrix} P \\ C \end{bmatrix} \quad \text{[Equation 1]}$$

In Equation 1 above, $\alpha$ is an element defined in a Galois Field (GF) $2^8$ space, n is the number of symbols included in a codeword to be encoded, matrix B is an n*1 matrix having symbols included in the codewords to be encoded as components, and P and C, which are symbols generated as a result of operation on the left side, may each be used as a plurality of ECC symbols. Through ECC encoding, the ECC encoder 120 may generate an ECC codeword including components in the matrices B and P and C as symbols.

When using the Reed Solomon code, the second device 200 may correct an error that occurred to a symbol at an arbitrary position. In addition, when using the Reed Solomon code, the second device 200 may correct errors that occurred to two symbols at specific positions.

Although not shown in FIG. 1, the first device 100 may include a transmitter. The transmitter may transmit the plurality of ECC codewords, which are generated by the ECC encoder 120, to the second device 200 through the channel 300.

The channel 300 may be used as a data transmission path between the first device 100 and the second device 200. The channel 300 may deliver the plurality of ECC codewords, which are transmitted from the first device 100, to the second device 200. For example, the channel 300 may be a physical transmission medium over which data or information signals can be sent by one or more senders (e.g., first device 100) and received by one or more receivers (e.g., second device 200). The physical transmission media can include, for example, cable pathways (e.g., wire, cable, fiber-optics, etc.) or broadcast pathways (e.g., radio, satellite, microwave, infrared, etc.).

The channel 300 may include one or more lanes. The plurality of ECC codewords transmitted from the first device 100 may be transmitted to the second device 200 through the one or more lanes. The first device 100 may interleave the plurality of ECC codewords to correspond to the number of lanes included in the channel 300 and output the plurality of ECC codewords to the one or more lanes.

When the plurality of ECC codewords are transmitted from the first device 100 to the second device 200 through the channel 300, errors may occur to some of the data. For example, such errors may be referred to as transmission errors or channel errors.

The second device 200 may restore the transmission data by decoding the plurality of ECC codewords received from the first device 100 through the channel 300. Accordingly, the second device 200 may be referred to as a receiving device.

The second device 200 may include an ECC decoder 210, a CRC checker 220, a post ECC decoder 230, and a post CRC checker 240.

The ECC decoder 210 may generate a first CRC codeword by performing error correction with respect to the plurality of ECC codewords. The ECC decoder 210 may generate a plurality of post ECC codewords by performing error correction with respect to each of the plurality of ECC codewords. The ECC decoder 210 may generate a first CRC codeword by interleaving the plurality of post ECC codewords.

The CRC checker 220 may determine whether an error exists in the first CRC codeword. The CRC checker 220 may perform a CRC check with respect to the first CRC codeword to determine whether the error exists in the first CRC codeword.

When it is determined that the error exists in the first CRC codeword, the post ECC decoder 230 may perform error correction with respect to the plurality of post ECC codewords based on error correction result information.

When it is determined that the error exists in the first CRC codeword, the post ECC decoder 230 may estimate a remaining error position based on the error correction result information received from the ECC decoder 210. In addition, the post ECC decoder 230 may generate a second CRC codeword by performing remaining error correction with respect to the plurality of post ECC codewords based on the remaining error position. Here, a remaining error indicates an error included in the plurality of post ECC codewords despite the error correction by the ECC decoder 210, and the remaining error position may refer to a position of a symbol, in which the remaining error exists, in the plurality of post ECC codewords.

The post CRC checker 240 may determine whether an error exists in the second CRC codeword. The post CRC checker 240 may perform a CRC check with respect to the second CRC codeword to determine whether the error exists in the second CRC codeword.

Configurations and operations of the second device 200 may be further described with reference to FIG. 2.

Figure 2:
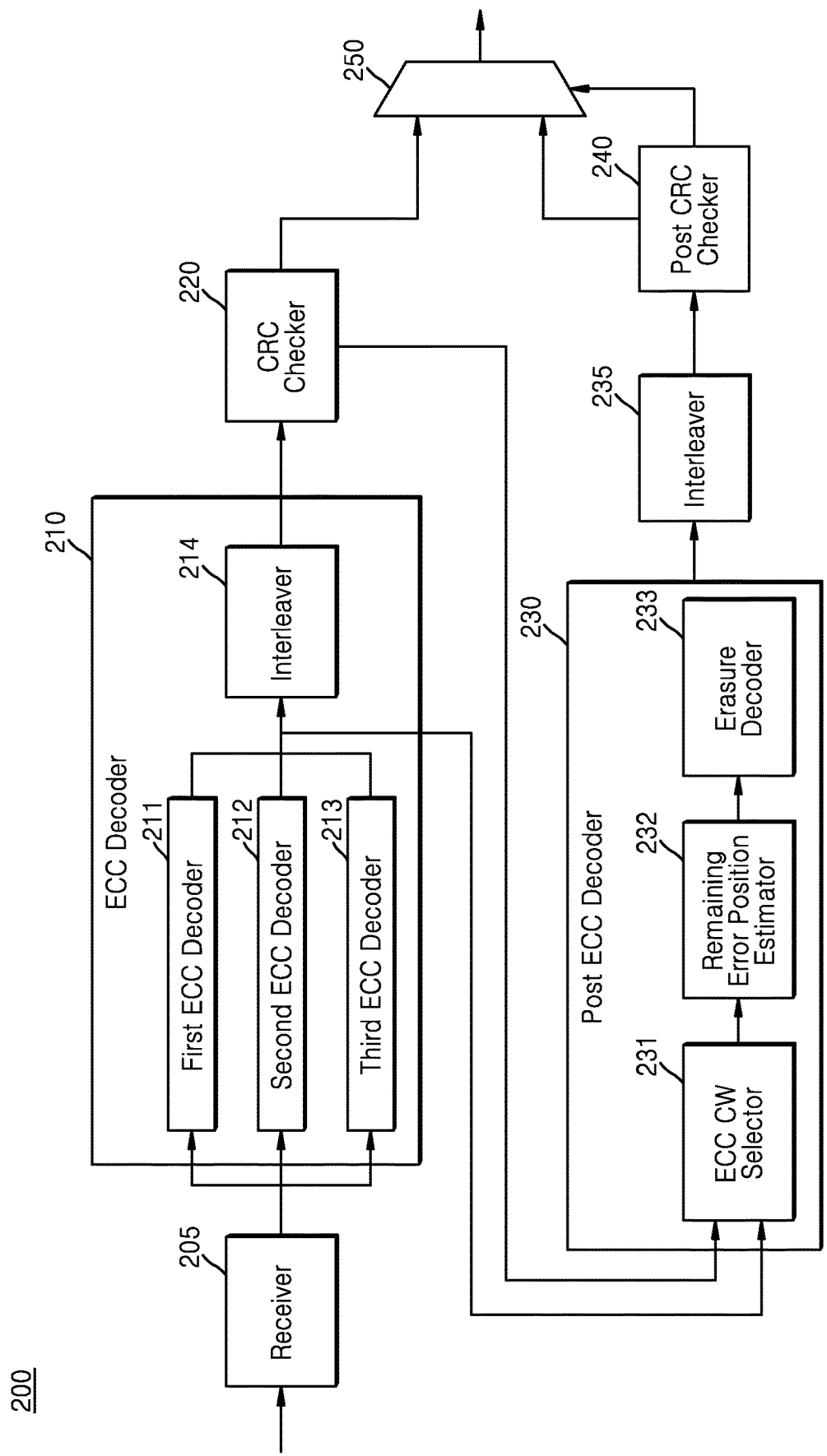
FIG. 2 is a block diagram of a second device, according to an example embodiment.

FIG. 2 is a block diagram of a second device 200 according to an example embodiment of the inventive concept.

Referring to FIG. 2, the second device 200 according to an example embodiment of the inventive concept may include a receiver 205, the ECC decoder 210, the CRC checker 220, and the post ECC decoder 230. In addition, the second device 200 according to an example embodiment of the inventive concept may further include an interleaver 235, the post CRC checker 240, and a selection circuit 250.

The receiver 205 may receive the plurality of ECC codewords transmitted from an external device (e.g., the first device 100 shown in FIG. 1) through the channel 300 including the one or more lanes.

The receiver 205 may receive the plurality of ECC codewords from the external device. The plurality of ECC codewords may be interleaved by the external device and transmitted to the receiver 205 through the one or more lanes. An example of the plurality of ECC codewords received through the receiver 205 is further described with reference to FIG. 3; and an example in which the plurality of ECC codewords are interleaved to the one or more lanes is further described with reference to FIG. 4.

Figure 3:
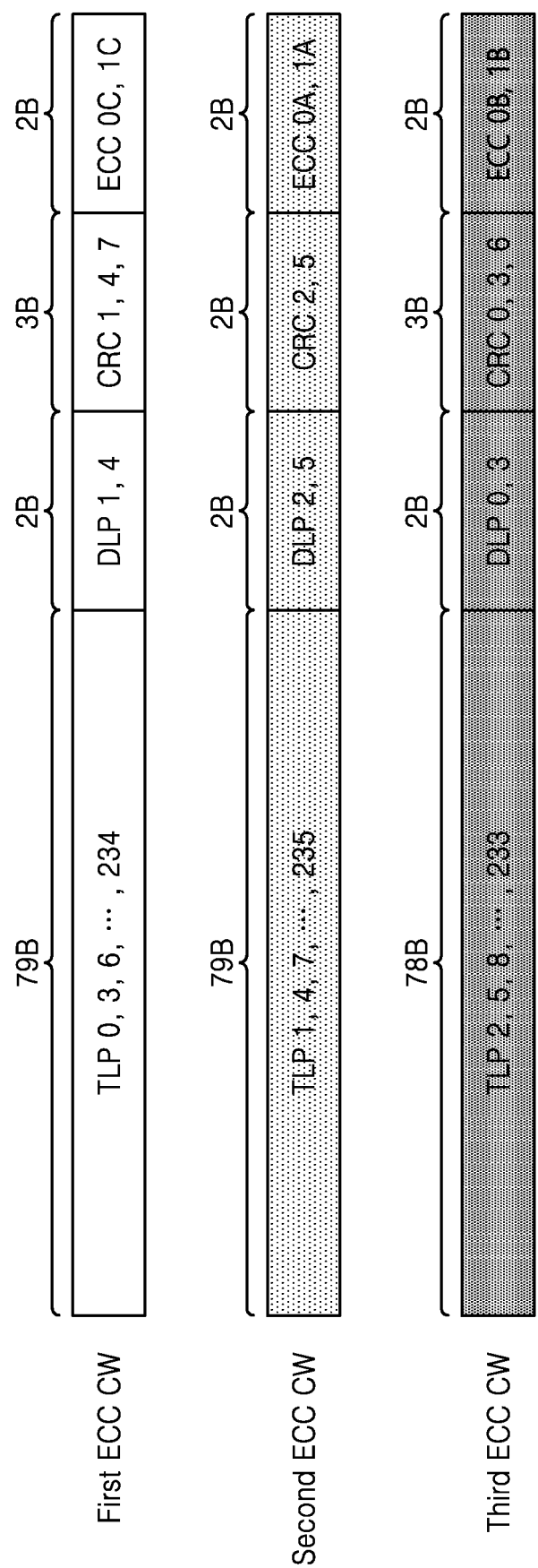
FIG. 3 is a diagram of an example of a plurality of Error Correction Code (ECC) codewords received by a device, according to an example embodiment.

FIG. 3 is a diagram of an example of the plurality of ECC codewords received by a device according to an example embodiment of the inventive concept.

Referring to FIG. 3, the example of the plurality of ECC codewords may be seen. In an embodiment of the inventive concept, the plurality of ECC codewords may include a first ECC codeword, a second ECC codeword, and a third ECC codeword.

In an embodiment of the inventive concept, the first ECC codeword, the second ECC codeword, and the third ECC codeword may each include a plurality of transaction layer packet (TLP) symbols, a plurality of data link packet (DLP) symbols, a plurality of CRC symbols, and a plurality of ECC symbols.

In an embodiment of the inventive concept, the plurality of TLP symbols may include two hundred and thirty-six symbols of 1 byte each, and may be referred to as TLP 0, TLP 1, TLP 2, . . . , and TLP 235 in order. The plurality of DLP symbols may include six symbols of 1 byte each, and may be referred to as DLP 0, DLP 1, DLP 2, . . . , and DLP 5 in order. In an embodiment of the inventive concept, the plurality of CRC symbols may include eight symbols of 1 byte each, and may be referred to as CRC 0, CRC 1, CRC 2, . . . , and CRC 7 in order. The plurality of ECC symbols may include six symbols of 1 byte each, and may be referred to as ECC 0A, ECC 0B, ECC 0C, ECC 1A, ECC 1B, and ECC 1C.

In an embodiment, the first ECC codeword may include the plurality of TLP symbols referred to as TLP 0, TLP 3, TLP 6, . . . , and TLP 234. The second ECC codeword may include the plurality of TLP symbols referred to as TLP 1, TLP 4, TLP 7, . . . , and TLP 235. The third ECC codeword may include the plurality of TLP symbols referred to as TLP 2, TLP 5, TLP 8, . . . , and TLP 233.

In an embodiment, the first ECC codeword may include the plurality of DLP symbols referred to as DLP 1 and DLP 4. The second ECC codeword may include the plurality of DLP symbols referred to as DLP 2 and DLP 5. The third ECC codeword may include the plurality of DLP symbols referred to as DLP 0 and DLP 3.

In an embodiment, the first ECC codeword may include the plurality of CRC symbols referred to as CRC 1, CRC 4, and CRC 7. The second ECC codeword may include the plurality of CRC symbols referred to as CRC 2 and CRC 5. The third ECC codeword may include the plurality of CRC symbols referred to as CRC 0, CRC 3, and CRC 6.

Here, as the CRC codeword is de-interleaved by the ECC encoder 120 shown in FIG. 1, the plurality of TLP symbols, the plurality of DLP symbols, and the plurality of CRC symbols may be cross-inserted into the plurality of ECC codewords.

In an embodiment of the inventive concept, the first ECC codeword may include the plurality of ECC symbols referred to as ECC 0C and ECC 1C. The second ECC codeword may include the plurality of ECC symbols referred to as ECC 0A and ECC 1A. The third ECC codeword may include the plurality of ECC symbols referred to as ECC 0B and ECC 1B.

Here, the plurality of ECC symbols are generated as a result of ECC encoding operation with respect to the plurality of codewords generated by de-interleaving the CRC codeword by the ECC encoder 120 shown in FIG. 1. Therefore, the plurality of ECC symbols generated by a same ECC encoding operation may be inserted into a same ECC codeword.

The plurality of ECC codewords described above may be interleaved by the external device and transmitted to the receiver 205 through the one or more lanes. Details thereof may be further described with reference to FIG. 4.

FIG. 4 is a diagram of an example in which the plurality of ECC codewords received by a device according to an example embodiment are interleaved to a plurality of lanes.

Referring to FIG. 4, a table indicates a method in which the symbols included in the plurality of ECC codewords are interleaved to a first lane to a fourth lane. Although FIG. 4 illustrates in which the plurality of ECC codewords are interleaved to four lanes, the embodiment is not limited thereto, and the plurality of ECC codewords may be interleaved in a method similar to a method to be described later, according to the number of lanes included in the channel 300.

In an embodiment, the plurality of ECC codewords may be interleaved to the first lane to the fourth lane such that the symbols included in a same ECC codeword are not simultaneously transmitted through neighboring lanes. In addition, the plurality of ECC codewords may be interleaved to the first lane through the fourth lane in a scheme that the symbols included in a same ECC codeword are not continuously transmitted through a same lane.

For example, the TLP 0 symbol included in the first ECC codeword may be transmitted through the first lane. Simultaneously, the TLP 1 symbol included in the second ECC codeword may be transmitted through the second lane, the TLP 2 symbol included in the third ECC codeword may be transmitted through the third lane, and the TLP 3 symbol included in the first ECC codeword may be transmitted through the fourth lane. Here, symbols included in different ECC codewords may be transmitted through adjacent lanes.

Next, the TLP 4 symbol included in the second ECC codeword may be transmitted through the first lane. Simultaneously, the TLP 5 symbol included in the third ECC codeword may be transmitted through the second lane, the TLP 6 symbol included in the first ECC codeword may be transmitted through the third lane, and the TLP 7 symbol included in the second ECC codeword may be transmitted through the fourth lane. Here, symbols included in different ECC codewords may be transmitted through adjacent lanes, and symbols included in a same ECC codeword may be not continuously transmitted through a same lane.

According to the method described above, the TLP 8 symbols to TLP 235 symbols may be transmitted through the first lane through the fourth lane, and the plurality of DLP symbols, the plurality of CRC symbols, and the plurality of ECC symbols may be transmitted through the first lane to the fourth lane.

Referring again to FIG. 2, the receiver 205 may de-interleave the plurality of ECC codewords received through one or more lanes and transmit de-interleaved ECC codewords to the ECC decoder 210. As shown in the embodiment of FIG. 4, the receiver 205 may de-interleave the plurality of ECC codewords that have been interleaved and transmitted, and may transmit the de-interleaved ECC codewords to the ECC decoder 210 as shown in the embodiment of FIG. 3. However, the embodiment is not limited thereto, and unlike in the embodiments described above, the plurality of ECC codewords may be de-interleaved by the ECC decoder 210 to be described later.

The ECC decoder 210 may generate a first CRC codeword by performing error correction with respect to the plurality of ECC codewords.

The ECC decoder 210 may receive, from the receiver 205, the plurality of ECC codewords that have been de-interleaved. The ECC decoder 210 may perform an ECC decoding operation with respect to each of the plurality of ECC codewords, to thereby correct errors in each of the plurality of ECC codewords and generate a plurality of post ECC codewords.

In an embodiment, the ECC decoder 210 may perform the ECC decoding operation using a Reed Solomon code. For example, the ECC decoder 210 may perform the ECC decoding operation by performing operation as in Equation 1 using each of the plurality of ECC codewords. The ECC decoder 210 may correct the errors in each of the plurality of ECC codewords by correcting components of the ECC codewords to satisfy Equation 1.

According to the method, the ECC decoder 210 may correct an error that occurred to a symbol at an arbitrary position with respect to each of the plurality of ECC codewords. For example, the ECC decoder 210 may correct an error that occurred to any one of the symbols included in the first ECC codeword, an error that occurred to any one of the symbols included in the second ECC codeword, and/or an error that occurred to any one of the symbols included in the third ECC codeword.

In an embodiment, the ECC decoder 210 may include a first ECC decoder 211, a second ECC decoder 212, and a third ECC decoder 213. The first ECC decoder 211 may perform an ECC decoding operation with respect to the first ECC codeword, to thereby correct errors in the first ECC codeword and generate a first post ECC codeword. The second ECC decoder 212 may perform an ECC decoding operation with respect to the second ECC codeword, to thereby correct errors in the second ECC codeword and generate a second post ECC codeword. The third ECC decoder 213 may perform an ECC decoding operation with respect to the third ECC codeword, to thereby correct errors in the third ECC codeword and generate a third post ECC codeword.

In an embodiment of the inventive concept, the ECC decoder 210 may include an interleaver 214. The interleaver 214 may generate the first CRC codeword by interleaving the plurality of post ECC codewords. The ECC decoder 210 may generate the first CRC codeword by interleaving symbols except the plurality of ECC symbols among the plurality of post ECC codewords. The first CRC codeword may include the plurality of TLP symbols, the plurality of DLP symbols, and the plurality of CRC symbols. The first CRC codeword may be identical to the CRC codeword generated by the CRC encoder 110 shown in FIG. 1; however, when the first CRC codeword includes an error, the first CRC codeword may be different from the CRC codeword generated by the CRC encoder 110 shown in FIG. 1.

Although FIG. 2 illustrates an embodiment in which the interleaver 214 is included in the ECC decoder 210, the embodiment is not limited thereto, and the interleaver 214 may be separately provided outside the ECC decoder 210, or may be included in the CRC checker 220 to be described later.

The ECC decoder 210 may perform error correction with respect to each of the plurality of ECC codewords, and may generate error correction result information.

The error correction result information may indicate an error correction matter indicating whether an error included in each of plurality of ECC codewords has been corrected and an error correction position indicating a position of a symbol, an error of which has been corrected, in an ECC codeword that has undergone error correction among the plurality of ECC codewords. The error correction result information may be used for performance of error correction by the post ECC decoder 230 to be described later. The error correction matter may be data or information indicating whether an error included in each of plurality of ECC codewords has been corrected.

The CRC checker 220 may determine whether an error exists in the first CRC codeword. The CRC checker 220 may perform CRC check operation on the basis of the first CRC codeword and a CRC generation code and may determine whether the error exists.

In an embodiment, the CRC checker 220 may determine whether the error exists in the first CRC codeword, based on whether a remainder of a result obtained by dividing the first CRC codeword by the CRC generation code used by the CRC encoder 110 shown in FIG. 1 is zero. When the remainder of the result obtained by dividing the first CRC codeword by the CRC generation code is zero, the CRC checker 220 may determine that the error does not exist in the first CRC codeword. On the contrary, when the remainder of the result obtained by dividing the first CRC codeword by the CRC generation code is not zero, the CRC checker 220 may determine that the error exists in the first CRC codeword.

The CRC checker 220 may output first restored data, which is obtained by removing the plurality of CRC symbols from the first CRC codeword, to the selection circuit 250 to be described later. In addition, when it is determined that the error exists in the first CRC codeword, the CRC checker 220 may transmit a signal notifying that the error exists in the first CRC codeword to the post ECC decoder 230.

The post ECC decoder 230 may receive, from the CRC checker 220, the signal indicating whether the error exists in the first CRC codeword. In addition, the post ECC decoder 230 may receive the plurality of ECC codewords that have undergone error correction and the error correction result information from the ECC decoder 210.

When it is determined that the error exists in the first CRC codeword based on the signal received from the CRC checker 220, the post ECC decoder 230 may estimate a remaining error position based on the error correction result information received from the ECC decoder 210. In addition, the post ECC decoder 230 may perform remaining error correction with respect to the plurality of post ECC codewords based on the remaining error positions. As described above, according to an embodiment, the ECC decoder 210 may perform error correction with respect to the plurality of ECC codewords, and the post ECC decoder 230 may perform remaining error correction with respect to the plurality of post ECC codewords.

The post ECC decoder 230 may include an ECC codeword selector 231, a remaining error position estimator 232, and an erasure decoder 233.

The ECC codeword selector 231 may select a correction target ECC codeword from among the plurality of post ECC codewords, based on the error correction matter included in the error correction result information received from the ECC decoder 210.

More particularly, based on the error correction matter, the ECC codeword selector 231 may select an ECC codeword, an error of which has not been corrected, as a correction target ECC codeword from among the plurality of post ECC codewords. For example, when the errors in the second ECC codeword and the third ECC codeword are corrected by the ECC decoder 210 and the error in the first ECC codeword is not corrected, the ECC codeword selector 231 may select the first ECC codeword as a correction target ECC codeword.

The remaining error position estimator 232 may estimate the remaining error position in the correction target ECC codeword, based on the error correction position included in the error correction result information received from the ECC decoder 210.

The remaining error position estimator 232 may estimate an error pattern corresponding to the error correction position. In an embodiment, the error pattern may include a burst error pattern, a first crosstalk error pattern, and a second crosstalk error pattern. The burst error pattern may indicate an error pattern in which errors occurred to symbols continuously transmitted through a same lane. The first crosstalk error pattern may indicate an error pattern in which errors occurred to symbols respectively transmitted at different time points through different lanes. The second crosstalk error pattern may indicate an error pattern in which errors occurred to symbol transmitted at a same time point through different lanes.

The remaining error position estimator 232 may estimate the remaining error positions based on the error patterns. A method of estimating the remaining error positions based on the types of the error patterns by the remaining error position estimator 232 is described later with reference to FIGS. 5 to 7.

The erasure decoder 233 may generate the second CRC codeword by performing remaining error correction with respect to the plurality of post ECC codewords based on the remaining error positions. Here, the erasure decoder 233 may generate the second CRC codeword by performing remaining error correction with respect to the correction target ECC codeword among the plurality of post ECC codewords, based on the remaining error positions.

In an embodiment, the erasure decoder 233 may perform the ECC decoding operation using a Reed Solomon code. For example, the erasure decoder 233 may perform the ECC decoding operation using Equations 2 and 3 below.

$$\begin{bmatrix} 1 & 1 & 1 & \cdots & 1 & 1 & 1 \\ \alpha^n & \alpha^{n-1} & \alpha^{n-2} & & \alpha^3 & \alpha^2 & \alpha \end{bmatrix} \begin{bmatrix} d_n \\ 0 \\ d_{n-2} \\ \vdots \\ d_m \\ 0 \\ \vdots \\ d_1 \end{bmatrix} = \begin{bmatrix} P^e \\ C^e \end{bmatrix} \quad \text{[Equation 2]}$$

$$\begin{bmatrix} 1 & 1 \\ \alpha^{n-1} & \alpha^{m-1} \end{bmatrix} \begin{bmatrix} d'_{n-1} \\ d'_{m-1} \end{bmatrix} = \begin{bmatrix} P + P^e \\ C + C^e \end{bmatrix} \quad \text{[Equation 3]}$$

In Equations 2 and 3, $\alpha$ may indicate an element defined in a GF $2^8$ space, n is the number of symbols included in a codeword to be decoded, $d_1$ to $d_n$ indicate the plurality of TLP symbols, the plurality of DLP symbols, and the plurality of symbols included in the ECC codewords, $P^e$ and $C^e$ are symbols generated as a result obtained by calculating the left side of the equations, P and C indicate the plurality of ECC symbols included in the ECC codewords, and $d_{n-1}'$ and $d_{m-1}'$ may include symbols that have undergone remaining error correction.

More particularly, the erasure decoder 233 may first calculate $P^e$ and $C^e$ using Equation 2. Here, in Equation 2, symbols corresponding to the remaining error positions among $d_1$ to $d_n$ ($d_{n-1}$ and $d_{m-1}$ in Equation 2) may be set as zero.

In addition, the erasure decoder 233 may correct remaining errors of the correction target codewords by searching for $d_{n-1}'$ and $d_{m-1}'$ satisfying Equation 3 using $P^e$ and $C^e$ calculated in Equation 2 and correcting $d_{n-1}$ and $d_{m-1}$ of the correction target ECC codeword to be $d_{n-1}'$ and $d_{m-1}'$. As described above, the erasure decoder 233 may correct remaining errors that occurred to two symbols at specific positions.

As described above, the erasure decoder 233 may generate the second CRC codeword by correcting the correction target ECC codeword and interleaving the plurality of post ECC codewords, the remaining errors of which have been corrected. However, unlike the embodiment, when the second device 200 includes the interleaver 235 as in the embodiment shown in FIG. 2, the erasure decoder 233 may generate the second CRC codeword by transmitting the plurality of post ECC codewords, the remaining errors of which have been corrected, to the interleaver 235, and may interleave the plurality of post ECC codewords by the interleaver 235.

The post CRC checker 240 may determine whether an error exists in the second CRC codeword. The post CRC checker 240 may determine that the error exists in the second CRC codeword using a same method performed by the CRC checker 220.

The post CRC checker 240 may output second restored data, which is obtained by removing the plurality of CRC symbols from the second CRC codeword, to the selection circuit 250 to be described later. In addition, when it is determined that the error exists in the second CRC codeword, the post CRC checker 240 may transmit re-transmission request to an external device. For example, when the errors in the plurality of ECC codewords are not all corrected even by the post ECC decoder 230, the re-transmission request with respect to the plurality of ECC codewords may be transmitted to the external device.

The selection circuit 250 may select and output one of the first restored data generated on basis of the first CRC codeword and the second restored data generated on basis of the second CRC codeword, based on a result of determination by the CRC checker 220 and the post CRC checker 240. For example, when it is determined that the error does not exist by the CRC checker 220, the selection circuit 250 may select and output the first restored data. In addition, when the existence of errors is determined by the CRC checker 220 and the non-existence of errors is determined by the post CRC checker 240, the selection circuit 250 may select and output the second restored data.

Using the aforementioned device according to the embodiment, re-transmission is not requested even when it is determined that the errors exist in the first CRC codeword and the remaining error correction is performed based on the error correction result information, and accordingly, the errors that occurred to the data may be more securely corrected. In addition, the remaining error correction is performed to more securely correct the errors without transmitting re-transmission requests, and by doing so, a data re-transmission rate may be reduced, and decrease in a broadband width of the channel due to data re-transmission may be prevented.

FIG. 5 is a diagram for describing a method of estimating remaining error positions when errors of a burst error pattern occurred to the data received by the device according to an example embodiment.

Referring to FIGS. 2 and 5, a table indicating that the first ECC codeword to the third ECC codeword are interleaved to the first lane to the fourth lane may be seen in the upper portion of FIG. 5, and a table indicating that the first ECC codeword to the third ECC codeword are de-interleaved may be seen in the lower portion of FIG. 5.

It may be seen that the embodiment shown in FIG. 5 is an embodiment in which errors of the burst error pattern occurs to the TLP 0 symbol, TLP 4 symbol, TLP 8 symbol, and TLP 12 symbol transmitted through the first lane, as shown by broken lines in the table in the upper portion of FIG. 5. As described above, when the errors occurred in the plurality of ECC codewords, the first ECC codeword may include errors in the TLP 0 symbol and the TLP 12 symbol, the second ECC codeword may include an error in the TLP 4 symbol, and the third ECC codeword may include an error in the TLP 8 symbol.

Here, the ECC decoder 210 may correct an error that occurred to a symbol at an arbitrary position, and therefore, may correct an error that occurred to the TLP 4 symbol of the second ECC codeword and an error that occurred to the TLP8 symbol of the third ECC codeword. However, the ECC decoder 210 may not correct errors that occurred in the TLP 0 symbol and TLP 12 symbol of the first ECC codeword. As described above, as the errors are corrected by the ECC decoder 210, the CRC checker 220 determines that the errors exist in the first CRC codeword, and the remaining error correction may be performed by the post ECC decoder 230.

The post ECC decoder 230 may perform the remaining error correction based on the error correction result information received from the ECC decoder 210.

The ECC codeword selector 231 of the post ECC decoder 230 may select the first post ECC codeword, which has not undergone error correction, as the correction target ECC codeword.

Next, the remaining error position estimator 232 of the post ECC decoder 230 may estimate error patterns based on the error correction positions. The remaining error position estimator 232 may check that the error correction positions include the TLP 4 symbol of the second ECC codeword and the TLP 8 symbol of the third ECC codeword, may check that errors occurred to the symbols continuously transmitted through a same lane, and may estimate that the error pattern includes the burst error pattern.

In addition, the remaining error position estimator 232 may estimate remaining error positions in the correction target ECC codeword, and based on the estimated remaining error positions the error pattern is estimated as the burst error pattern. Here, the remaining error position estimator 232 may estimate positions, as the remaining error positions, which are transmitted at a time point adjacent to time points at which the TLP 4 symbol of the second ECC codeword and the TLP 8 symbol of the third ECC codeword are transmitted and corresponding to the TLP 0 symbol and TLP 12 symbol included in the first post ECC codeword.

The erasure decoder 233 may generate the second CRC codeword by performing remaining error correction with respect to the TLP 0 symbol and the TLP 12 symbol of the first post ECC codeword corresponding to the remaining error positions of the correction target ECC codeword. The erasure decoder 233, which may correct errors that occurred to two symbols at specific positions, may successfully complete the remaining error correction with respect to the TLP 0 symbol and the TLP 12 symbol of the first post ECC codeword.

As described above, by using the second device 200 according to an embodiment, errors of the burst error pattern that occurred to four continuous symbols may be corrected, and accordingly, the errors may be more securely corrected, and by doing so, a data re-transmission rate may be reduced, and decrease in a broadband width of a channel due to data re-transmission may be prevented.

FIG. 6 is a diagram for describing a method of estimating a remaining error position when an error of the first crosstalk pattern occurs to data received by the device according to an example embodiment of the inventive concept.

Referring to FIGS. 2 and 6, a table indicating that the first ECC codeword to the third ECC codeword are interleaved to the first lane to the fourth lane may be seen in the upper portion of FIG. 6, and a table indicating that the first ECC codeword to the third ECC codeword are de-interleaved may be seen in the lower portion of FIG. 6.

It may be seen that the embodiment shown in FIG. 6 is an embodiment in which errors of the first crosstalk error pattern occurred to the TLP 9 symbol, TLP 10 symbol, TLP 13 symbol, and TLP 14 symbol transmitted through the second lane and the third lane, as marked with broken lines in the table in the upper portion of FIG. 6. As described above, when the errors occurred to the plurality of ECC codewords, the first ECC codeword may include an error in the TLP 9 symbol, the second ECC codeword may include errors in the TLP 10 symbol and the TLP 13 symbol, and the third ECC codeword may include an error in the TLP 14 symbol.

Here, the ECC decoder 210, which may correct an error that occurred to a symbol at an arbitrary position, may correct an error that occurred to the TLP 9 symbol of the first ECC codeword and an error that occurred in the TLP 14 symbol of the third ECC codeword. However, the ECC decoder 210 may not correct errors that occurred to the TLP 10 symbol and TLP 13 symbol of the second ECC codeword. As described above, the errors are corrected by the ECC decoder 210, and the CRC checker 220 determines that the errors exist in the second CRC codeword, and therefore, the remaining error correction may be performed by the post ECC decoder 230.

The post ECC decoder 230 may perform the remaining error correction based on the error correction result information received from the ECC decoder 210.

The ECC codeword selector 231 of the post ECC decoder 230 may select the second post ECC codeword, which has not undergone error correction, as the correction target ECC codeword.

Next, the remaining error position estimator 232 of the post ECC decoder 230 may estimate error patterns based on the error correction positions. The remaining error position estimator 232 may check that the error correction positions include the TLP 9 symbol of the first ECC codeword and the TLP 14 symbol of the third ECC codeword, may check that errors occurred to the symbols continuously transmitted at different time points through different lanes, and may estimate that the error patterns include the first crosstalk error pattern.

In addition, the remaining error position estimator 232 may estimate remaining error positions in the correction target ECC codeword, and based on the estimated remaining error positions the error pattern is estimated to be the first crosstalk error pattern. Here, the remaining error position estimator 232 may estimate, as remaining error positions, positions which are transmitted through a lane adjacent to the lane through which the TLP 9 symbol of the first ECC codeword and the TLP 14 symbol of the third ECC codeword are transmitted and which correspond to the TLP 10 symbol and TLP 13 symbol included in the second post ECC codeword.

The erasure decoder 233 may generate the second CRC codeword by performing remaining error correction with respect to the TLP 10 symbol and the TLP 13 symbol of the second post ECC codeword corresponding to the remaining error positions of the correction target ECC codeword. The erasure decoder 233, which may correct errors that occurred to two symbols at specific positions, may successfully complete the remaining error correction with respect to the TLP 10 symbol and the TLP 13 symbol of the second post ECC codeword.

As described above, by using the device according to an embodiment, errors of the first crosstalk error pattern that occurred to four symbols continuously transmitted through two adjacent lanes may be corrected, and the errors that occurred to data may be more securely corrected. By doing so, a data re-transmission rate may be decreased, and a decrease in a broadband width of a channel caused due to the data re-transmission may be prevented.

FIG. 7 is a diagram for describing a method of estimating remaining error positions when errors of a second crosstalk pattern occurred to data received by a device according to an example embodiment.

Referring to FIGS. 2 and 7, a table indicating that the first ECC codeword to the third ECC codeword are interleaved to the first lane to the fourth lane may be seen in the upper portion of FIG. 7, and a table indicating that the first ECC codeword to the third ECC codeword are de-interleaved may be seen in the lower portion of FIG. 7.

It may be seen that the embodiment shown in FIG. 7 is an embodiment in which errors of the second crosstalk error pattern occurred to the TLP 0 symbol, TLP 1 symbol, TLP 2 symbol, and TLP 3 symbol transmitted through the first lane to the fourth lane, as marked with broken lines in the table in the upper portion of FIG. 7. As described above, when the errors occurred to the plurality of ECC codewords, the first ECC codeword may include errors in the TLP 0 symbol and the TLP 3 symbol, the second ECC codeword may include errors in the TLP 1 symbol, and the third ECC codeword may include errors in the TLP 2 symbol.

Here, the ECC decoder 210 may correct errors that occurred on a symbol at an arbitrary position, and therefore, may correct errors that occurred to the TLP 1 symbol of the second ECC codeword and errors that occurred to the TLP 2 symbol of the third ECC codeword. However, the ECC decoder 210 may not correct errors that occurred to the TLP 0 symbol and TLP 3 symbol of the first ECC codeword. As described above, the errors are corrected by the ECC decoder 210, and the CRC checker 220 determines that the errors exist in the second CRC codeword, and therefore, the remaining error correction may be performed by the post ECC decoder 230.

The post ECC decoder 230 may perform the remaining error correction based on the error correction result information received from the ECC decoder 210.

The ECC codeword selector 231 of the post ECC decoder 230 may select the first post ECC codeword, which has not undergone error correction, as the correction target ECC codeword.

Next, the remaining error position estimator 232 of the post ECC decoder 230 may estimate error patterns based on the error correction positions. The remaining error position estimator 232 may check that the error correction positions include the TLP 1 symbol of the second ECC codeword and the TLP 2 symbol of the third ECC codeword, may check that errors occurred to the symbols simultaneously transmitted at a same time point through different lanes, and may estimate that the error patterns include the second crosstalk error pattern.

In addition, the remaining error position estimator 232 may estimate remaining error positions in the correction target ECC codeword, and based on the estimated remaining error positions the error pattern is estimated to be the second crosstalk error pattern. Here, the remaining error position estimator 232 may estimate, as remaining error positions, positions which are transmitted through a lane adjacent to the lane through which the TLP 1 symbol of the second ECC codeword and the TLP 2 symbol of the third ECC codeword are transmitted and which correspond to the TLP 0 symbol and the TLP 3 symbol included in the first post ECC codeword.

The erasure decoder 233 may generate the second CRC codeword by performing remaining error correction with respect to the TLP 0 symbol and the TLP 3 symbol of the first post ECC codeword corresponding to the remaining error positions of the correction target ECC codeword. The erasure decoder 233, which may correct errors that occurred to two symbols at specific positions, may successfully complete the remaining error correction with respect to the TLP 0 symbol and the TLP 3 symbol of the first post ECC codeword.

As described above, by using the device according to an embodiment, errors of the second crosstalk error pattern that occurred to four symbols transmitted through four adjacent lanes may be corrected, and the errors that occurred to the data may be more securely corrected. By doing so, a data re-transmission rate may be decreased, and a decrease in a broadband width with a channel due to the data re-transmission may be prevented.

Figure 8:
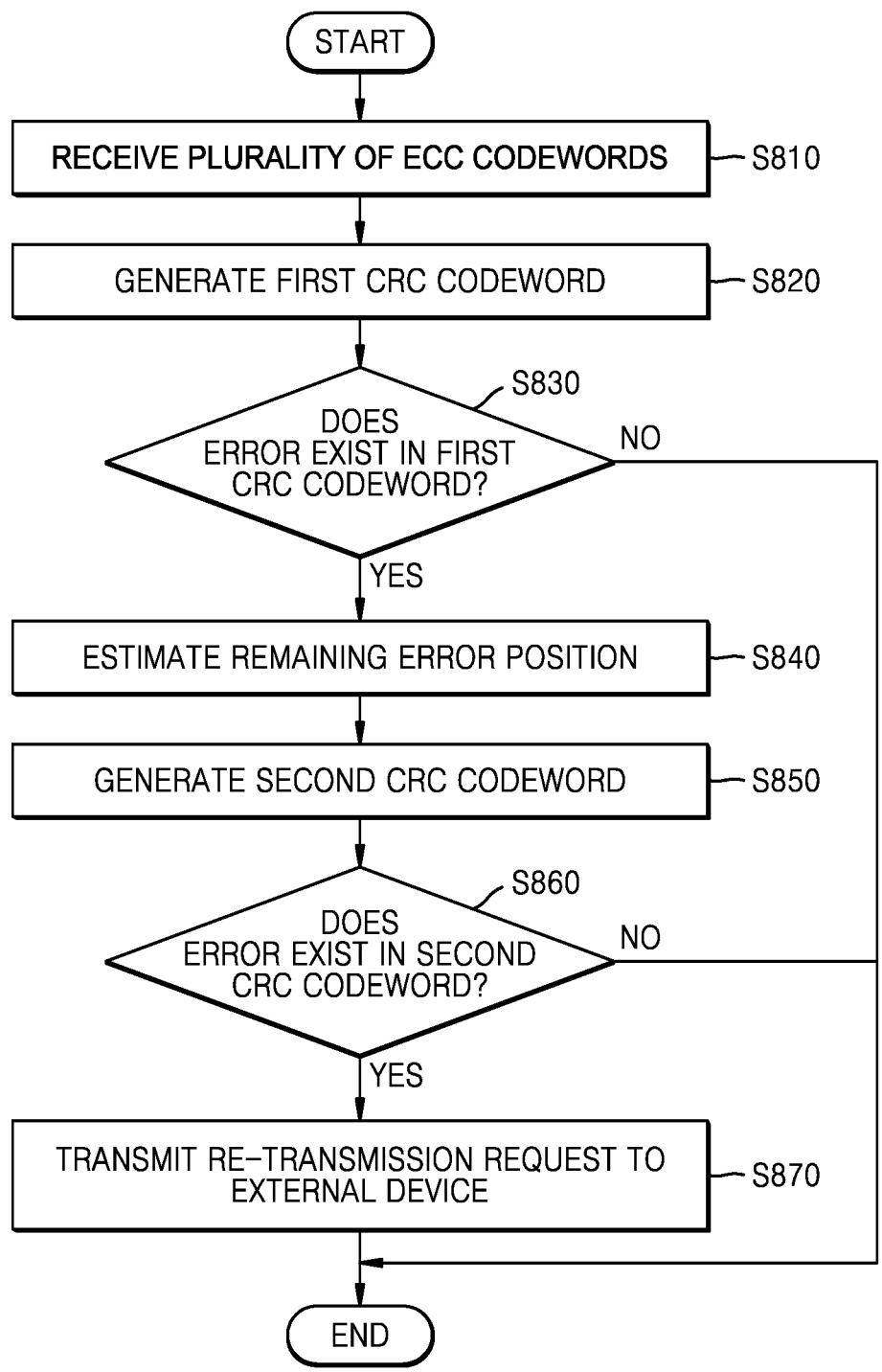
FIG. 8 is a flowchart of a method, according to an example embodiment.

FIG. 8 is a flowchart of a method according to an example embodiment.

Referring to FIG. 8, the method according to an embodiment may include operations performed in time series by the second device 200 shown in FIG. 2.

In operation S810, the receiver 205 may receive the plurality of ECC codewords. The receiver 205 may receive the plurality of ECC codewords transmitted from the external device through the channel 300 including the one or more lanes.

In operation S820, the ECC decoder 210 may generate the first CRC codeword. The ECC decoder 210 may perform an ECC decoding operation with respect to each of the plurality of ECC codewords, to thereby correct errors in each of the plurality of ECC codewords, generate the plurality of post ECC codewords, and may generate the first CRC codewords based on the plurality of post ECC codewords.

In operation S830, the CRC checker 220 may determine whether errors exist in the first CRC codeword. The CRC checker 220 may determine whether errors exist by performing an operation based on the first CRC codeword and the CRC generation code.

When the CRC checker 220 determines that the errors do not exist in the first CRC codeword, operation S830 may be finished.

In the alternative, when the CRC checker 220 determines that the errors exist in the first CRC codeword, operation S840 may be performed.

In operation S840, the post ECC decoder 230 may estimate remaining error positions. A method by which the post ECC decoder 230 estimates the remaining error positions may be described in further details with reference to FIG. 9.

Figure 9:
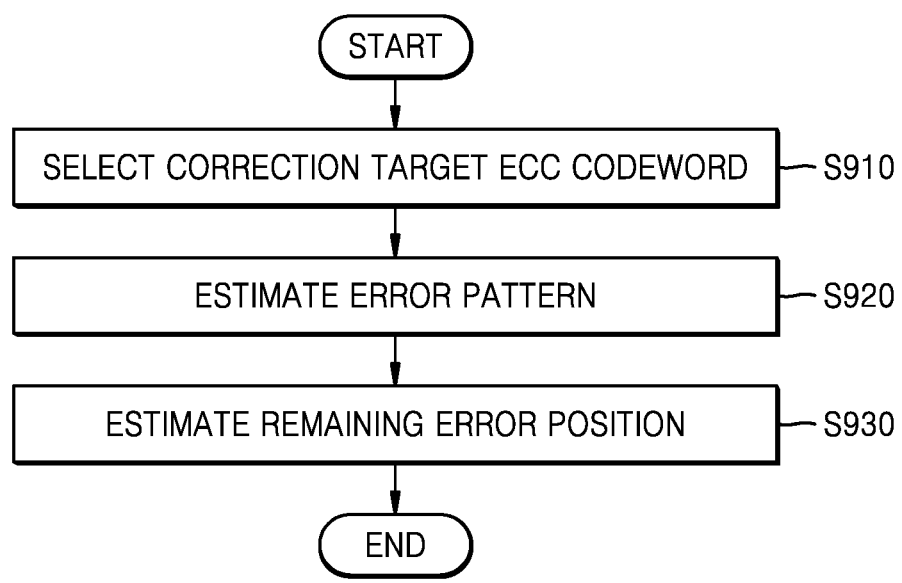
FIG. 9 is a flowchart for further describing a method of estimating a remaining error position, according to an example embodiment.

FIG. 9 is a flowchart for further describing a method of estimating remaining error positions in a method according to an example embodiment.

Referring to FIG. 9, the method according to an embodiment may include operations performed in a time series by the second device 200 shown in FIG. 2.

In operation S910, the post ECC decoder 230 may select the correction target ECC codeword. Based on the error correction matter included in the error correction result information, the post ECC decoder 230 may select an ECC codeword, an error of which has not been corrected, as a correction target ECC codeword from among the plurality of post ECC codewords.

In operation S920, the post ECC decoder 230 may estimate error patterns. The post ECC decoder 230 may estimate an error pattern of errors occurred in the correction target ECC codeword, based on the remaining error positions including the error correction result information.

In operation S930, the post ECC decoder 230 may estimate the remaining error positions. The post ECC decoder 230 may estimate the remaining error positions based on the error patterns estimated above. The method of estimating the remaining error positions based on the error patterns may be identical to the method described in detail with reference to FIGS. 5 to 7.

Referring again to FIG. 8, in operation S850, the post ECC decoder 230 may generate the second CRC codeword. The post ECC decoder 230 may perform an ECC decoding operation with respect to the correction target ECC codeword, to thereby correct errors in the correction target ECC codeword and generate the second CRC codeword.

In operation S860, the post CRC checker 240 may determine whether errors exist in the second CRC codeword. The post CRC checker 240 may determine whether errors exist by performing an operation based on the second CRC codeword and the CRC generation code.

When the post CRC checker 240 determines that the errors do not exist in the second CRC codeword, the operation may be finished.

In the alternative, when the post CRC checker 240 determines that the errors exist in the second CRC codeword, operation S870 may be performed.

In operation S870, the post CRC checker 240 may transmit a re-transmission request to the external device. When the errors in the plurality of ECC codewords are not all corrected even by the post ECC decoder 230, the post CRC checker 240 may transmit the re-transmission request for the plurality of ECC codewords to the external device.

Using the method according to an embodiment, even when it is determined that the errors exist in the first CRC codeword, the remaining error correction is performed based on the remaining error correction result information without request for the re-transmission, and accordingly, the errors occurred in the data may be more securely corrected. In addition, the remaining error correction is performed to more securely correct the errors without transmitting re-transmission requests, and by doing so, a data re-transmission rate may be reduced, and decrease in a broadband width of a channel due to data re-transmission may be prevented.

Figure 10:
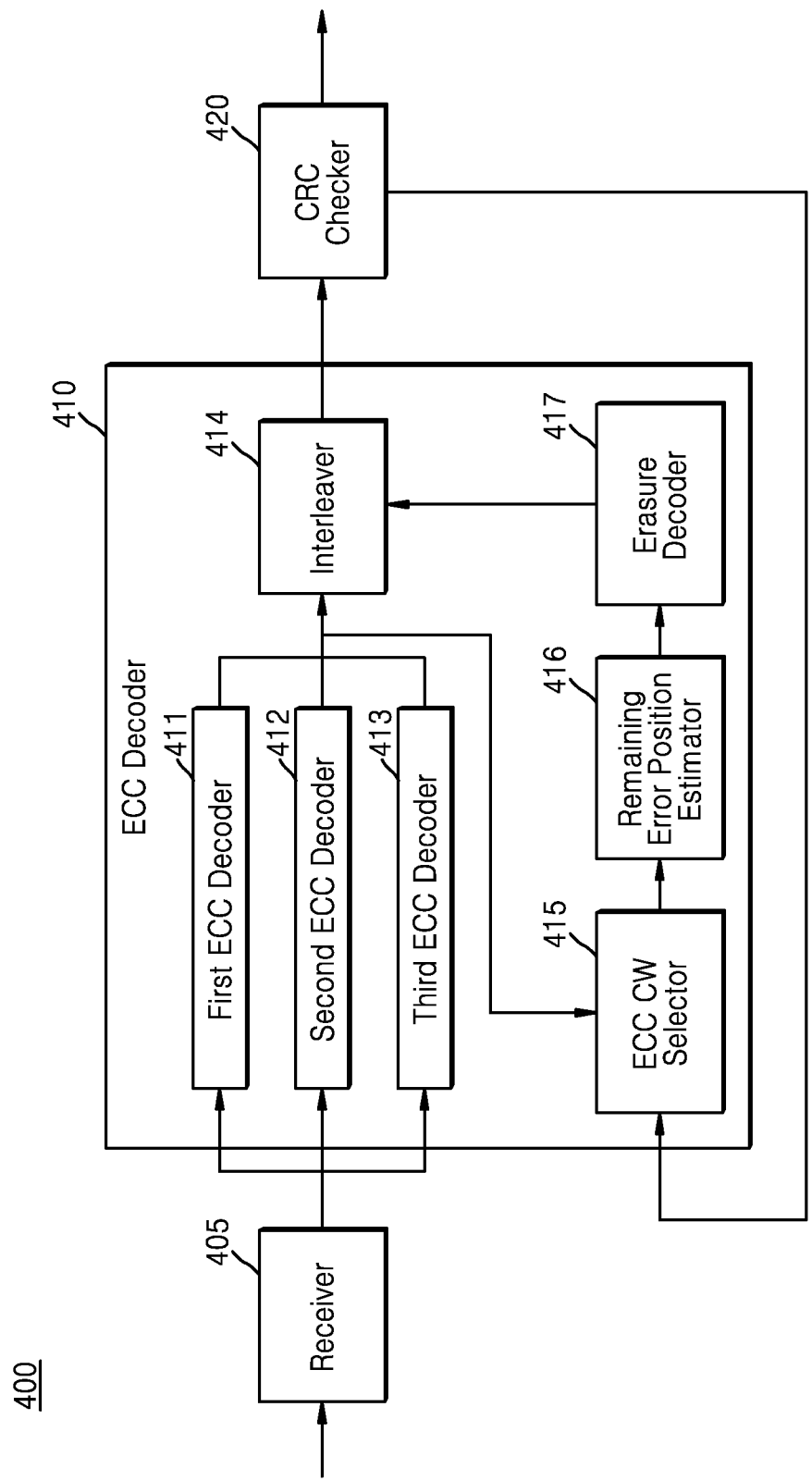
FIG. 10 is a block diagram of a device, according to an example embodiment.

FIG. 10 is a block diagram of a device according to an example embodiment of the inventive concept.

Referring to FIG. 10, a second device 400 according to an example embodiment may include a receiver 405, an ECC decoder 410, and a CRC checker 420.

Here, operations of the receiver 405 may be substantially identical to the operations of the receiver 205 shown in FIG. 2, and details described with reference to FIG. 2 may also be applied to the present embodiment.

The ECC decoder 410 may include a first ECC decoder 411, a second ECC decoder 412, a third ECC decoder 413, and an interleaver 414.

Here, operations of the first ECC decoder 411, the second ECC decoder 412, the third ECC decoder 413, and the interleaver 414 may be substantially identical to the operations of the first ECC decoder 211, the second ECC decoder 212, the third ECC decoder 213, and the interleaver 214 shown in FIG. 2, and details described with reference to FIG. 2 may also be applied to the present embodiment.

The ECC decoder 410 may include an ECC codeword selector 415, a remaining error position estimator 416, and an erasure decoder 417. Here, operations of the ECC codeword selector 415, the remaining error position estimator 416, and the erasure decoder 417 may be identical to the operations of the ECC codeword selector 231, the remaining error position estimator 232, and the erasure decoder 233, and details described with reference to FIG. 2 may also be applied to the present embodiment.

Accordingly, an operation of the ECC decoder 410 may be the same as the operation of the post ECC decoder 230 shown in FIG. 2.

The CRC checker 420 may perform operations of both of the CRC checker 220 and the post CRC checker 240 shown in FIG. 2.

The second device 400 according to an embodiment may be implemented as a single body by combination of the ECC decoder 210 and the post ECC decoder 230 and combination of the CRC checker 220 and the post CRC checker 240 of the second device 200 according to the embodiment shown in FIG. 2.

Figure 11:
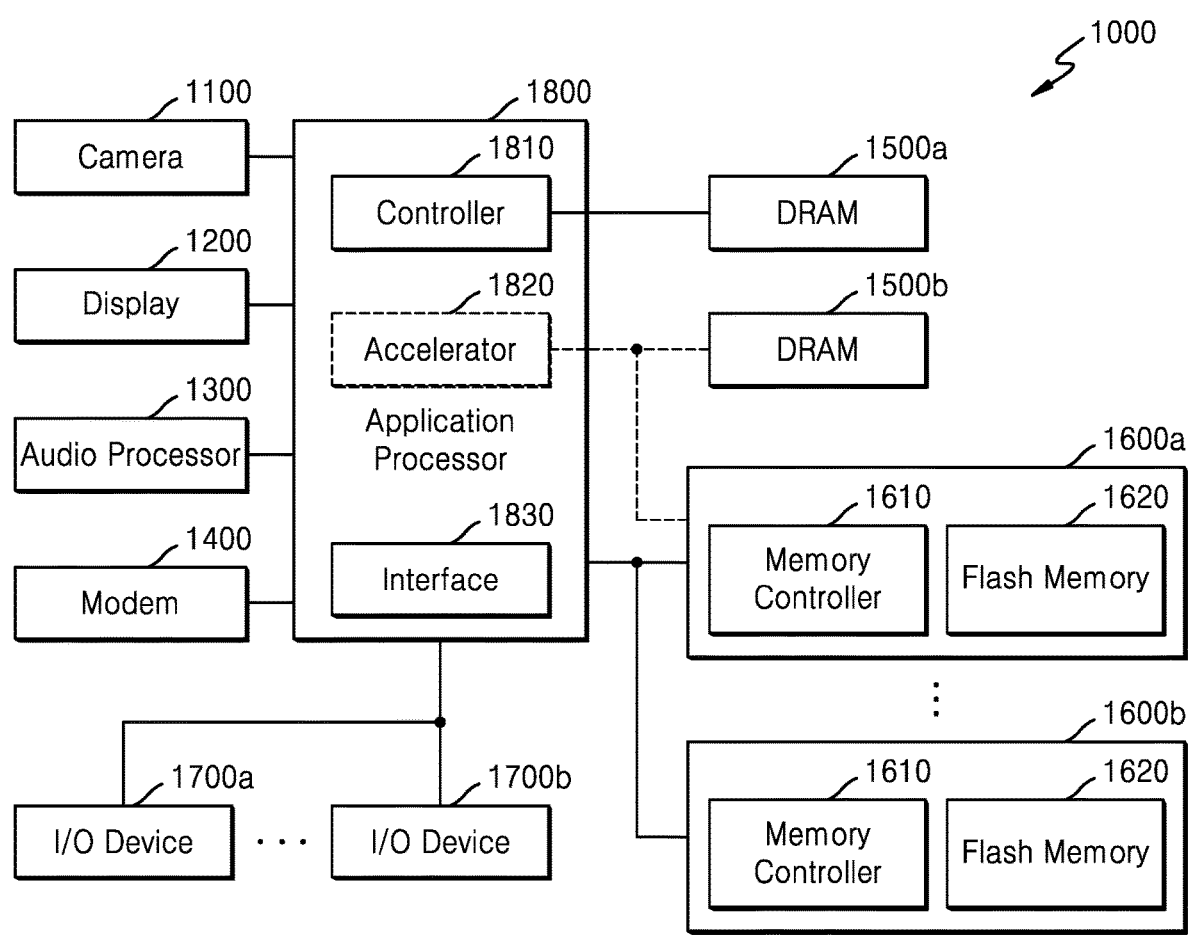
FIG. 11 is a circuit diagram of main components of a memory device, according to an example embodiment.

FIG. 11 is a diagram of main components of a system 1000 according to an example embodiment.

Referring to FIG. 11, the system 1000 may include a camera 1100, a display 1200, an audio processor 1300, a modem 1400, DRAMs 1500a and 1500b, flash memories 1600a and 1600b, I/O devices 1700a and 1700b, and an AP 1800. The system 1000 may be implemented as a smartphone, a tablet personal computer (PC), a wearable device, a health care device, or an Internet of Things (IoT) device. In addition, the system 1000 may be implemented as a server or a PC.

The camera 1100 may capture a still image or a moving image under the user's control and store the captured image and image data or transmit the captured image and the image data to the display 1200. The audio processor 1300 may process audio data included in the flash memories 1600a and 1600b or network content.

The modem 1400 may modulate and transmit signals for transmitting/receiving wired/wireless data, and may demodulate the signal to an original signal by the receiver. The I/O devices 1700a and 1700b may include devices configured to provide digital input and/or output functions, such as a universal serial bus (USB), a storage, a digital camera, a secure digital (SD) card, a digital versatile disc (DVD), a network adapter, and a touch screen.

The AP 1800 may control all operations of the system 1000. The AP 1800 may control the display 1200 such that some of the contents stored in the flash memories 1600a and 1600b are displayed on the display 1200. The AP 1800 may perform a control operation corresponding to a user's input when the AP 1800 receives the user's input through the I/O devices 1700a and 1700b. The AP 1800 may include an accelerator block, which is a dedicated circuit for an artificial intelligence (AI) data operation, or an accelerator chip 1820 may be provided separately from the AP 1800. The DRAM 1500b may be further mounted in the accelerator block or the accelerator chip 1820. The accelerator block may be a dedicated function block for a specific function of the AP 1800 and include a GPU, a neural processing unit (NPU), and a data processing unit (DPU). The GPU may be a dedicated function block configured to process graphics data, the NPU may be a dedicated block configured to perform AI calculations and inference, and the DPU may be a dedicated block configured to transmit data.

The system 1000 may include the DRAMs 1500a and 1500b. The AP 1800 may control the DRAMs 1500a and 1500b by using commands and mode register set (MRS) signals that conform to the JEDEC standard, or may communicate with the DRAMs 1500a and 1500b by setting a DRAM interface protocol to use enterprise-specific functions (e.g., low voltage/high speed/reliability) and CRC/ECC functions. For example, the AP 1800 may communicate with the DRAM 1500a through an interface complying with the JEDEC standard specification, and the accelerator block or the accelerator chip 1820 may set a new DRAM interface protocol and perform communication to control the DRAM 1500b, which is for the accelerator block and has a broadband width higher than that of the DRAM 1500a.

Although FIG. 11 only illustrates the DRAMs 1500a and 1500b, the embodiment is not limited thereto, and as long as broadband widths, reaction rates, and voltage conditions of the AP 1800 or the accelerator chip 1820 are satisfied, any memory, e.g., phase-change random access memory (PRAM), magnetoresistive random access memory (MRAM), resistive random access memory (RRAM), ferroelectric random access memory (FRAM), or Hybrid RAM, may be used. Compared with the I/O devices 1700a and 1700b or the flash memories 1600a and 1600b, the DRAMs 1500a and 1500b have less delay time and a smaller broadband widths. Each of the DRAMs 1500a and 1500b may be initialized at the time when the system 1000 is powered on. The DRAMs 1500a and 1500b may be used as temporary storages in which an operating system and application data are loaded, or as execution spaces for various software code.

Addition/subtraction/multiplication/division operations, vector operations, address operations, or Fast Fourier Transform (FFT) operations may be performed in the DRAMs 1500a and 1500b. In addition, a function used for inference may be performed by the DRAMs 1500a and 1500b. Here, the inference may be performed in a deep learning algorithm using an artificial neural network. The deep learning algorithm may include a training operation of training a model using various pieces of data and an inference operation of recognizing data based on the trained model. As an embodiment, an image captured by the user through the camera 1100 may be signal-processed and stored in the DRAM 1500b. The accelerator block or the accelerator chip 1820 may perform an AI data operation for recognizing data by using data stored in the DRAM 1500b and a function used for inference.

The system 1000 may include a plurality of storages or a plurality of flash memory devices, which have a larger capacity than the DRAMs 1500a and 1500b. The accelerator block or the accelerator chip 1820 may perform a training operation and an AI data calculation using the flash memories 1600a and 1600b. In one embodiment, the flash memories 1600a and 1600b may enable the AP 1800 and/or the accelerator chip 1820 to perform the training operation and an inference AI data operation efficiently by using a computing device included in a memory controller 1610. Each of the flash memories 1600a and 1600b may store an image captured by the camera 1100 or store received through a data network. For example, each of the flash memories 1600a and 1600b may store augmented reality/virtual reality content and/or high definition (HD) or ultra-high definition (UHD) content.

The devices included in the system 1000, i.e., the camera 1100, the display 1200, the audio processor 1300, the modem 1400, the DRAMs 1500a and 1500b, the flash memories 1600a and 1600b, the I/O devices 1700a and 1700b, and the AP 1800, may be configured by including configurations of the second device 200 according to the embodiment shown in FIG. 2 or the second device 400 according to the embodiment shown in FIG. 10. By doing so, errors occurring in a process of transmitting data through channels may be more securely corrected, and a data re-transmission rate may be reduced and a decrease in a broadband width of a channel due to data re-transmission may be prevented.

While the inventive concept has been particularly shown and described with reference to embodiments thereof, it will be understood that various changes in form and details may be made therein without departing from the spirit and scope of the following claims.

What is claimed is:

1. A device comprising:
a receiver configured to receive a plurality of Error Correction Code (ECC) codewords transmitted from an external device through a channel including one or more lanes;
an ECC decoder configured to generate a plurality of post ECC codewords by performing error correction with respect to the plurality of ECC codewords and generate a first CRC codeword based on the plurality of post ECC codewords;
a CRC checker configured to determine whether an error exists in the first CRC codeword; and
a post ECC decoder configured to, when it is determined that the error exists in the first CRC codeword, generate a second CRC codeword by estimating a remaining error position based on error correction result information received from the ECC decoder and performing remaining error correction with respect to the plurality of post ECC codewords based on the remaining error position.

2. The device of claim 1,
wherein the plurality of ECC codewords are interleaved by the external device and transmitted to the receiver to the one or more lanes, and
wherein the receiver is configured to de-interleave the plurality of ECC codewords and transmit the plurality of ECC codewords to the ECC decoder.

3. The device of claim 1, wherein the ECC decoder is configured to generate the plurality of post ECC codewords by performing error correction with respect to each of the plurality of ECC codewords and generate the first CRC codeword by interleaving the plurality of post ECC codewords.

4. The device of claim 1, wherein the error correction result information comprises:
an error correction matter indicating whether an error has been corrected in each of the plurality of ECC codewords; and
an error correction position indicating a position of a symbol, an error of which has been corrected, in an ECC codeword that has undergone error correction among the plurality of ECC codewords.

5. The device of claim 4, wherein the post ECC decoder is configured to:
select a correction target ECC codeword from among the plurality of post ECC codewords, based on the error correction matter,
estimate the remaining error position within the correction target ECC codeword based on the error correction position, and
generate the second CRC codeword by performing remaining error correction with respect to the correction target ECC codeword based on the remaining error position.

6. The device of claim 5, wherein the post ECC decoder is configured to select a post ECC codeword which has not undergone error correction, as a correction target ECC codeword, from among the plurality of post ECC codewords, based on the error correction matter.

7. The device of claim 5, wherein the post ECC decoder is configured to estimate an error pattern corresponding to the error correction position and estimate the remaining error position based on the error pattern.

8. The device of claim 1, wherein the post ECC decoder is configured to receive the plurality of post ECC codewords from the ECC decoder and generate the second CRC codeword by performing the remaining error correction with respect to the plurality of post ECC codewords based on the remaining error position.

9. The device of claim 1, wherein the post ECC decoder is configured to:
perform the remaining error correction with respect to the plurality of post ECC codewords and
generate the second CRC codeword by interleaving the plurality of post ECC codewords, remaining errors of which have been corrected.

10. The device of claim 1, further comprising a post CRC checker configured to determine whether an error exists in the second CRC codeword.

11. The device of claim 10, wherein the post CRC checker is configured to, when it is determined that an error exists in the second CRC codeword, transmit a re-transmission request to the external device.

12. The device of claim 10, further comprising a selection circuit configured to select and output one of first restored data, which is generated based on the first CRC codeword on the basis of a result of determination of the CRC checker and the post CRC checker, and second restored data generated based on the second CRC codeword.

13. A method of correcting errors in a plurality of error correction code (ECC) codewords, the method comprising:
receiving the plurality of ECC codewords from an external device through a channel comprising one or more lanes;
generating a plurality of post ECC codewords by performing error correction with respect to the plurality of ECC codewords and generating a first cyclic redundancy check (CRC) codeword based on the plurality of post ECC codewords;
determining whether an error exists in the first CRC codeword;
estimating a remaining error position based on error correction result information when it is determined that the error exists in the first CRC codeword; and
generating a second CRC codeword by performing remaining error correction with respect to the plurality of post ECC codewords based on the remaining error position.

14. The method of claim 13, wherein the error correction result information comprises:
an error correction matter indicating whether an error has been corrected in each of the plurality of ECC codewords; and
an error correction position indicating a position of a symbol, an error of which has been corrected, in an ECC codeword that has undergone error correction among the plurality of ECC codewords.

15. The method of claim 14, wherein the estimating of the remaining error position comprises:
selecting a post ECC codeword, which has not undergone error correction, from among the plurality of post ECC codewords as a correction target ECC codeword, based on the error correction matter;
estimating an error pattern corresponding to the error correction position; and
estimating the remaining error position in the correction target ECC codeword, based on the error pattern.

16. The method of claim 15, wherein the generating of the second CRC codeword comprises generating the second CRC codeword by performing the remaining error correction with respect to the correction target ECC codeword based on the remaining error position.

17. A device comprising:
a receiver configured to receive a plurality of Error Correction Code (ECC) codewords transmitted from an external device through a channel including one or more lanes;
an ECC decoder configured to generate a plurality of post ECC codewords by performing error correction with respect to the plurality of ECC codewords and generate a first Cyclic Redundancy check (CRC) codeword based on the plurality of post ECC codewords; and
a CRC checker configured to determine whether an error exists in the first CRC codeword,
wherein the ECC decoder is configured to, when it is determined that the error exists in the first CRC codeword, estimate a remaining error position based on error correction result information received from the ECC decoder and generate a second CRC codeword by performing remaining error correction with respect to the plurality of ECC codewords based on the remaining error position.

18. The device of claim 17, wherein the error correction result information comprises:
an error correction matter indicating whether an error has been corrected in each of the plurality of ECC codewords; and
an error correction position indicating a position of a symbol, an error of which has been corrected, in an ECC codeword that has undergone error correction among the plurality of ECC codewords.

19. The device of claim 18, wherein the ECC decoder is configured to:
select a post ECC codeword which has not undergone error correction, as a correction target ECC codeword, from among the plurality of post ECC codewords, based on the error correction matter,
estimate an error pattern corresponding to the error correction position,
estimate the remaining error position within the correction target ECC codeword based on the error pattern, and
generate the second CRC codeword by performing the remaining error correction with respect to the correction target ECC codeword based on the remaining error position.

20. The device of claim 17, wherein the CRC checker is configured to:
determine whether an error exists in the second CRC codeword, and
transmit a re-transmission request to the external device when it is determined that an error exists in the second CRC codeword.

* * * * *